United States Patent [19] [11] 4,158,882
Citta [45] Jun. 19, 1979

[54] FULL-WAVE RECTIFIER CIRCUIT
[75] Inventor: Richard W. Citta, Oak Park, Ill.
[73] Assignee: Zenith Radio Corporation, Glenview, Ill.
[21] Appl. No.: 881,266
[22] Filed: Feb. 27, 1978
[51] Int. Cl.² .............................................. H02M 7/21
[52] U.S. Cl. ...................................... 363/127; 328/26
[58] Field of Search ........................ 363/127; 307/262; 328/26; 329/50; 330/257

[56] References Cited
U.S. PATENT DOCUMENTS

| 3,805,093 | 4/1974 | Hodemaekers | 330/257 X |
| 3,970,870 | 7/1976 | Horichi | 328/26 X |
| 4,004,161 | 1/1977 | Ryder | 328/26 X |
| 4,004,247 | 1/1977 | van de Plassche | 330/257 |
| 4,053,796 | 11/1977 | van de Plassche | 328/26 X |
| 4,069,460 | 1/1978 | Saver | 330/257 |

Primary Examiner—J. D. Miller
Assistant Examiner—Peter S. Wong
Attorney, Agent, or Firm—Nicholas A. Camasto

[57] ABSTRACT

A full-wave rectifier circuit useful in a low level envelope type video detector or the like comprises a symmetrical network having a pair of input terminals and an output terminal, the output terminal developing a unidirectional flow of current in response to the application of an alternating current signal to at least one of the input terminals. The symmetrical network comprises first and second cross-coupled transistors-current mirror pairs, each transistor being operable for conducting output unidirectional current through its respective current mirror. The current mirrors are connected for responding to the alternating current developed at the input terminals for operating one or the other of the transistors depending upon the relative magnitude of current developed at the two input terminals. The rectifier may be operated from a dual output balanced source of current or, alternatively, in a single ended mode.

4 Claims, 5 Drawing Figures

FULL-WAVE RECTIFIER CIRCUIT

BACKGROUND OF THE INVENTION

The present invention relates in general to devices for rectifying alternating current signals. More specifically, the invention relates to a full-wave rectifier finding particular utility in low-level envelope type video detection circuits.

Conventionally, a received television signal is in the form of an RF carrier modulated by a video signal. In the television receiver, the modulated RF carrier is typically converted to an intermediate frequency (IF) signal which is filtered and amplified and then applied to a video detector. The video detector demodulates the modulated IF signal to recover the video information in the form of a video signal. The video signal developed by the video detector is subsequently coupled through various signal processing circuits in the receiver and finally to the electron gun structure of the picture tube for producing an observable image corresponding to the video information characterizing the transmitted television signal. The video signal is also coupled to a synchronizing signal separator circuit which develops signals applied to deflection circuitry for controlling the deflection of the electron beam produced by the electron gun structure in synchronism with the horizontal and vertical synchronizing components of the video signal. The output of the video detector is also normally applied to an automatic gain control circuit which controls a variable gain amplifier to maintain the amplitude of the video signal substantially constant.

Prior art video detectors can be conveniently classified into two basic varieties; namely, synchronous detectors and envelope or peak detectors. Synchronous video detectors generally comprise circuitry for multiplying the modulated IF subcarrier signal with a phase and frequency controlled regenerated carrier signal to effect a rectification of the IF subcarrier. The rectified product is subsequently coupled through a suitable low-pass filter for recovering the video information. Examples of prior art synchronous detectors of this type are shown in U.S. Pat. Nos. 3,961,360 to Sato et al, 3,764,925 to Von Nikelsberg et al, 3,871,022 to Wilcox and 3,624,275 to Lunn. Although synchronous detectors of the general type illustrated in these patents possess a number of desirable attributes, including generally excellent low-level signal handling capabilities, various practical considerations have recently been encountered which militate against their use in the roll of a television receiver video detector in certain situations.

Envelope or peak type video detectors conventionally comprise a rectifier, such as a diode, connected for rectifying the modulated IF subcarrier signal and a low-pass filter for removing the subcarrier signal from the half-wave rectified output developed by the diode. Sometimes, a plurality of diodes are used to full-wave rectify the modulated IF signal before coupling it to the low-pass filter. In either event (i.e., full-wave or half-wave rectification), however, the modulated IF subcarrier signal must reach a level of about 0.6–0.7 volt to render the rectifying diode conductive. Stated otherwise, for input signal levels less than about 0.6–0.7 volts the rectifying diode is non-conductive thereby introducing a degree of distortion into the rectified output signal. The effect of this distortion is normally minimized by driving the diode with a relatively large input signal, generally about 3 volts, compared to the 0.6 volts necessary to cause the diode to conduct. While this practice has heretofore been considered acceptable, as more integrated circuitry is used in the design of electronic equipment and in the design of television receivers in particular, the task of providing such relatively high level input signals has rendered the use of conventional diode rectifiers unattractive.

U.S. Pat. No. 4,069,460 to Sauer discloses a current comparator circuit which, if used as a rectifier, may overcome some of the foregoing problems in the prior art. The circuit disclosed in this reference is, however, relatively inflexible and not readily modifiable to provide increased linearity in situations where it is desired to precisely demodulate an input signal. In particular, the rectified output is produced at the collectors of a pair of switching transistors whose states are controlled by circuitry characterized by a pre-established error which may not be conveniently reduced in situations where a more nearly linear operating characteristic is desired.

It is, therefore, a basic object of the present invention to provide an improved rectifier circuit capable of operating in response to relatively low-level input signals.

It is a more specific object of the invention to provide an improved full-wave rectifier circuit useful in association with a low-pass filter for providing a low-level envelope type video detector.

SUMMARY OF THE INVENTION

In accordance with these and other useful objects there is provided a full-wave rectifier having two input terminals and an output terminal for developing a unidirectional flow of current in response to an alternating current applied to at least one of the input terminals. The rectifier comprises first and second switching means each coupled to the output terminal and each operable for conducting a unidirectional flow of current therethrough. A control means is responsive to the alternating current developed at the input terminals for operating only the first switching means in response to the alternating current at one of the input terminals exceeding the current at the other terminal and for operating only the second switching means in response to the latter current exceeding the former. In the preferred embodiment of the invention, the rectifier comprises a symmetrical network consisting of two cross-coupled transistor-current mirror pairs, the transistors comprising the aforementioned switching means and the current mirrors the control means. In addition, the rectifier may be operated as a single ended device wherein an alternating current is applied only to one of the input terminals or as a differential device wherein balanced alternating currents are supplied to the two input terminals.

DESCRIPTION OF THE PREFERRED EMBODIMENT

Figure 1:
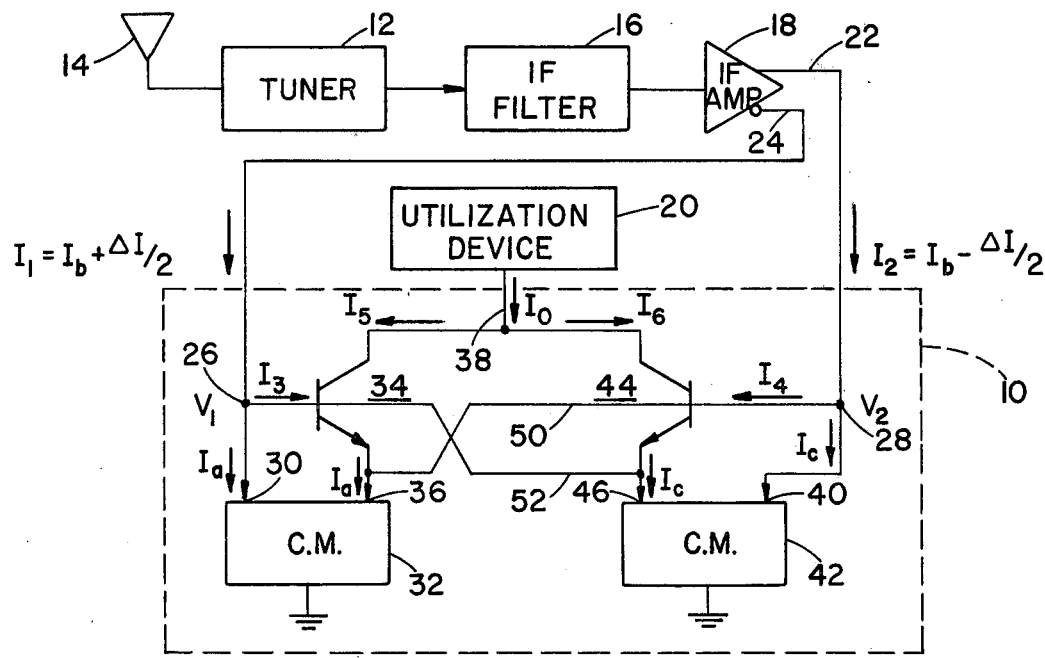
FIG. 1 schematically illustrates one embodiment of the full-wave rectifier of the present invention used as a low-level video detector in a conventional television receiver.

For purposes of illustration the full-wave rectifier of the present invention, generally indicated by reference numeral 10 in FIGS. 1 and 2, will be described herein with reference to its use as the rectifying element of a television receiver low-level envelope type video detector. It is to be understood, however, that such use is not intended to limit the invention which should be considered as having general utility as a full-wave rectifier circuit.

Referring now to the drawings and, in particular to FIG. 1, the illustrated television receiver has a tuner 12 whose input terminal is connected to a receiving antenna 14. Tuner 12 customarily includes suitable circuitry for converting a selected one of the available RF video carriers to a lower frequency subcarrier having a predetermined intermediate frequency (IF). An IF filter 16 and an IF amplifier 18 comprise an IF section characterized for providing appropriate amplification and a suitable frequency bandpass and associated traps to ensure rejection of unwanted subcarriers. The output of IF amplifier 18 is coupled through rectifier 10 to a utilization device 20. Utilization device 20 includes a low-pass filter for forming, in association with rectifier 10, an envelope type video detector. In addition, utilization device 20 includes the diverse other circuits of the television receiver which operate on the detected video signal.

Figure 3:
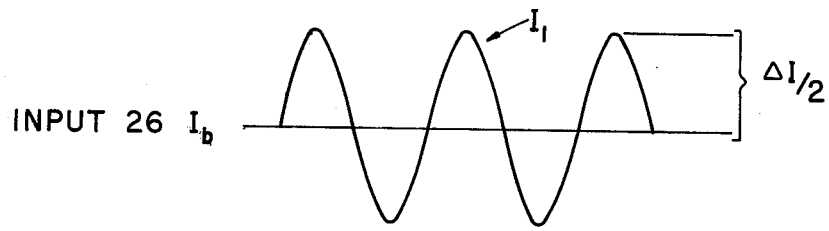
FIG. 3 shows the input and output waveforms of the rectifier illustrated in FIG. 1.
Figure 3:
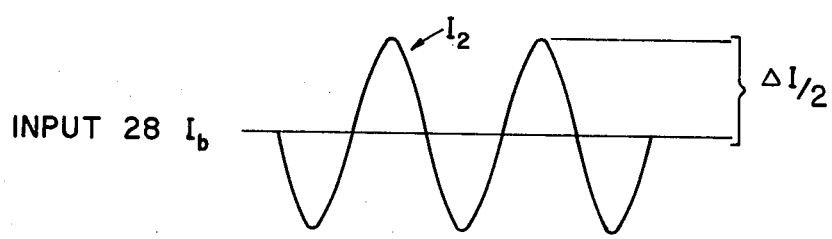
Figure 3:
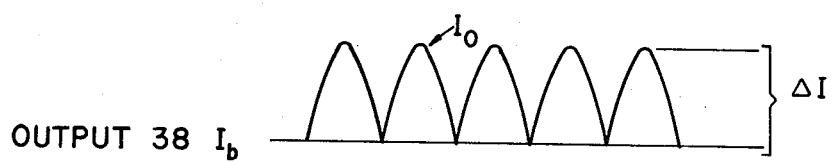

It will be noted that the IF amplifier illustrated in FIG. 1 is a balanced device having two outputs 22 and 24. As shown in FIG. 3, output 24 of IF amplifier 18 develops a current $I_1$ having the form $I_b + \Delta I/2$ while output 22 develops a current $I_2$ 180° out of phase therewith and which may be represented as $I_b - \Delta I/2$. In the foregoing expression for currents $I_1$ and $I_2$, the term $I_b$ represents a constant DC bias current whereas the term $\Delta I$ represents an alternating current component superimposed upon the DC bias current. It will, of course, be understood that the purpose of rectifier 10 is to rectify the alternating current component $\Delta I$ of output currents $I_1$ and $I_2$.

With further reference to FIG. 1, rectifier 10 comprises a symmetrical network having a pair of input nodes 26 and 28 connected to outputs 24 and 22 respectively of IF amplifier 18. Node 26 is also coupled to the dependent input 30 of a current mirror 32 and to the base of a switching transistor 34. The emitter of transistor 34 is coupled to the independent input 36 of current mirror 32 while its collector electrode is connected to an output line 38 of rectifier 10.

In a similar manner, node 28 of rectifier 10 is connected to the dependent input 40 of a second current mirror 42 and also to the base of a second switching transistor 44. The emitter of transistor 44 is connected to the dependent input 46 of current mirror 42 while its collector is connected to rectifier output 38. Finally, the sections of rectifier 10 are cross-coupled by means of a first line 50 connected between the emitter of transistor 34 and the base of transistor 44 and by a second line 52 connected between the emitter of transistor 44 and the base of transistor 34.

It will be understood by those skilled in the art that devices such as current mirrors 32 and 42 are well-known circuit elements having input and output terminals wherein the current flowing at the output terminal is directly controlled by or dependent upon the current flowing in the input terminal. Referring, for example, to current mirror 32, the current introduced at input 36 may vary freely and is determined primarily by circuit parameters and conditions external of the current mirror. On the other hand, the current developed at output 30 is determined solely by the current established at input 36. Thus, the current mirror results in the establishment of a current at output 30 whose value is essentially equal to or directly follows the value of the current developed at input 36. Of course, similar considerations apply with respect to current mirror 42 and its input 46 and output 40.

Before proceeding with a discussion of the operation of rectifier 10, it will be instructive to develop various relationships characterizing the circuit. Initially, it will be observed that the current $I_0$ characterizing output terminal 38 (see FIG. 3) is defined by the relationship $I_0 = I_5 + I_6$, where $I_5$ and $I_6$ are the collector currents of transistors 34 and 44 respectively. Next, input current $I_1$ is given by the relation $I_1 = I_b + \Delta I/2 = I_3 + I_a$, where $I_a$ is the current established at output 30 of current mirror 32. Now, since current $I_a$ is also developed at input 36 of current mirror 32, it follows that the expression for input current $I_1$ can be expressed as $I_1 = I_b + \Delta I/2 = I_3 + I_4 + I_5$. Analogously, it can be shown that input current $I_2$ is given by the expression $I_2 = I_b - \Delta I/2 = I_3 + I_4 + I_6$. Subtracting the expression for input current $I_2$ from the expression for input current $I_1$ results in the expression $\Delta I = I_5 - I_6$.

The operation of full-wave rectifier 10 will now be considered in detail. Initially, assume that the alternating current component $\Delta I/2$ of input currents $I_1$ and $I_2$ supplied to nodes 26 and 28 has a value of zero such that both input currents are equal to the DC bias current $I_b$. Under this condition, and due to the symmetrical characteristics of rectifier 10 wherein transistors 34 and 44 are essentially identical components and current mirrors 32 and 42 are similarly essentially identical components, the input currents $I_1$ and $I_2$ divide equally at nodes 26 and 28 such that $I_3 = I_a = I_4 = I_c$. As a result, the voltage $V_1$ characterizing node 26 is equal to the voltage $V_2$ characterizing node 28. Since the base to emitter voltage ($V_1$-$V_2$) of transistor 34 is therefore equal to zero, the transistor is non-conductive and collector current $I_5$ is equal to zero. Similarly, the base to emitter voltage ($V_2$-$V_1$) of transistor 44 is equal to zero thereby also rendering this transistor non-conductive so that collector current $I_6$ likewise equals zero. The previously derived expression $\Delta I = I_5 - I_6$ thus reduces to $I_5 = I_6 = 0$.

Next, assume that alternating current component $\Delta I/2$ goes positive such as during the positive half cycle of input current $I_1$. In this case, input current $I_1$ increases in value while the value of input current $I_2$ decreases proportionately. Since current $I_a$ supplied to output 30 of current mirror 32 cannot immediately change, the increase in input current $I_1$ is manifested by an increase in base current $I_3$ which is coupled to input 46 of current mirror 42 by line 52. The current $I_c$ established at output 40 of current mirror 42 therefore increases in value thereby drawing a greater proportion of decreased input current $I_2$ such that current $I_4$ flowing in line 50 substantially decreases. Decreased current $I_4$ is supplied to input 36 of current mirror 32 causing the current established at output 30 to likewise decrease. The decreased current established at output 30 of current mirror 32 will cause the voltage $V_1$ at node 26 to increase whereas the increased current established at output 40 of current mirror 42 will cause the voltage $V_2$ at node 28 to decrease. Consequently, the base to emitter junction of transistor 34 becomes forward biased enabling the flow of collector current $I_5$. Transistor 44, however, remains non-conductive due to the reverse bias its base-emitter junction so that collector current $I_6$ remains zero. The expression $\Delta I = I_5 - I_6$ thus reduces to $I_0 = I_5 = \Delta I$. The latter expression, of course, indicates that output current $I_0$ is constituted by collector current $I_5$ and is equal to alternating current $\Delta I$.

During the negative half cycle of input circuit $I_1$, input current $I_2$ decreases in value while current $I_1$ proportionately decreases. Performing an analysis similar to that explained above, it will be appreciated that for this condition current $I_a$ established at output 30 of current mirror 32 increases relative to its value when $\Delta I/2$ is zero while the current $I_c$ established at output 40 of current mirror 42 decreases. As a result, the voltage $V_2$ at node 28 increases and the voltage $V_1$ at node 26 decreases rendering transistor 44 conductive and transistor 34 non-conductive. Collector current $I_6$ therefore flows through transistor 44 while collector current $I_5$ is cut off. The expression $\Delta I = I_5 - I_6$ now reduces to $I_0 = I_6 = -(\Delta I) = (-\Delta I)$. Thus, during the negative half cycle of input current $I_1$, output current $I_0$ is constituted by collector current $I_6$ and is equal to alternating signal component $(-\Delta I)$.

By combining the results obtained during the positive and negative half cycles of input current $I_1$ it will be seen that output current $I_0$ is defined by the relationship $I_0$ = absolute value $(\Delta I)$. This mathematically represents the condition that output $I_0$ comprises a linear full-wave rectified version of the alternating signal component $\Delta I$ of input currents $I_1$ and $I_2$. Moreover, it will be observed that the foregoing analysis is not dependnet upon the establishment of any particular voltage levels at input nodes 26 and 28. On the contrary, rectifier 10 is responsive only to input current signals and is consequently operable at extremely low input signal levels making it particularly useful in implementing, for example, a low-level envelope video detector.

Rectifier 10 illustrated in FIG. 1 was explained as operating from an IF amplifier providing a differential input signal. However, as shown in FIG. 2, the rectifier may also be operated as a single ended device where an IF amplifier such as shown at 58 provides only a single input $\Delta I$. In this case, node 26 is supplied from a current source 60 providing a constant DC bias current $I_b$. Corresponding node 28 is supplied by the output of IF amplifier 58 as well as by a constant current source 62 also providing a DC bias current $I_b$. In all other respects the operations of the rectifier shown in FIG. 2 is essentially identical to that shown in FIG. 1. More particularly, when alternating signal component $\Delta I$ goes positive, the current established at node 28 increases relative to the current established at node 26. Transistor 44 is therefore conductive while transistor 34 is non-conductive enabling the flow of collector current $I_6$ and cutting off collector current $I_5$. On the other hand, during the negative half cycle of alternating signal component $\Delta I$, the current at node 28 decreases relative to the current at node 26. Transistor 34 is now rendered conductive while transistor 44 is cut off so that only collector current $I_5$ is produced. The rectification action of the circuit is therefor identical to that described above. It will, however, be noted that the output current developed by rectifier 10 operated when in a single ended configuration is decreased by ½ relative to the output current developed when operating the rectifier in a differential mode.

Figure 2:
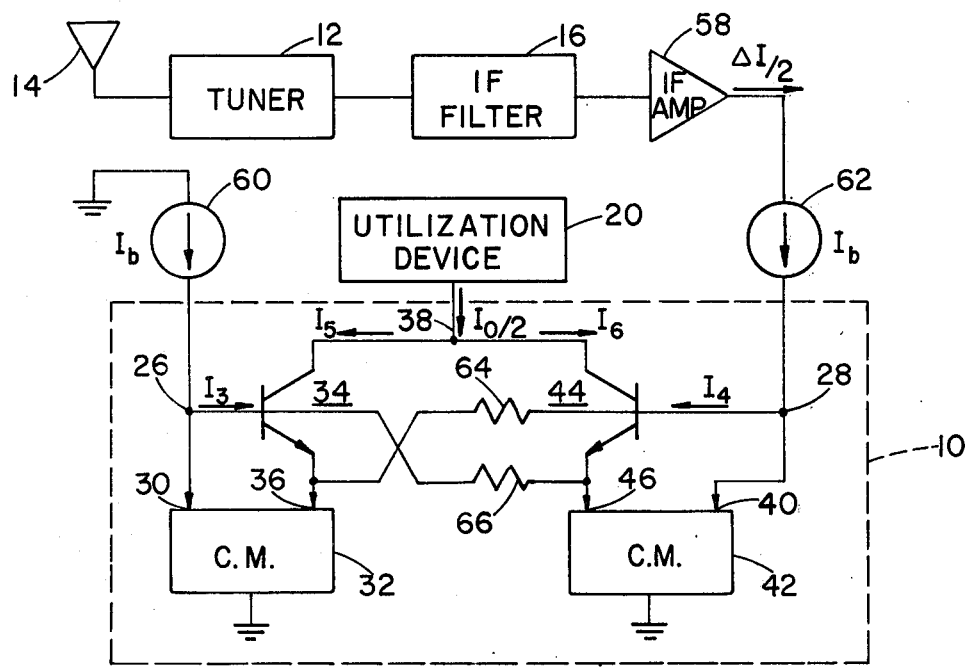
FIG. 2 illustrates another embodiment of the full-wave rectifier of the present invention also used as a low-level video detector in a television receiver.

With further reference to FIG. 2, it will be seen that resistors 64 and 66 have been connected in series with lines 50 and 52 respectively. The purpose of resistors for 64 and 66 is to provide a slight bias for transistors 34 and 44 to increase their switching speed. For normal operating conditions, these resistors should be chosen so as to develop a voltage drop less than the base to emitter junction voltage of the transistors to ensure proper switching action. However, if in a given application a voltage offset is desired, such as is normally produced in a conventional diode rectifier, resistors 64 and 66 may be chosen for developing a voltage drop greater than the base to emitter junction voltage of transistors 34 and 44.

Figure 4:
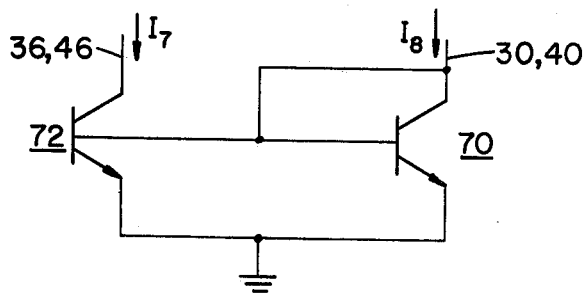
FIG. 4 schematically shows a two transistor current mirror useful in the circuits of FIG. 1 and FIG. 2.

FIG. 4 illustrates a well-known current mirror suitable for accomplishing the function of current mirrors 32 and 42. The illustrated current mirror comprises a diode-connected transistor 70 whose base-collector junction forms the device's input 30, 40 for coupling an input current $I_8$. A second transistor 72 has its base and emitter terminals connected to the base and emitter terminals respectively of transistor 70. The collector of transistor 72 forms the output 36, 46 of the current mirror for establishing an output current $I_7$. Assuming that both transistors 70 and 72 have identical characteristics, a prerequisite established by IC fabrication techniques, it can be shown that the transfer function $I_8/I_7 = \beta/(\beta+2)$. Thus, as beta increases, the value of current $I_7$ approaches that of input current $I_8$. In fact, when the transistor beta is equal to 100 the difference between the two currents is only two percent.

Figure 5:
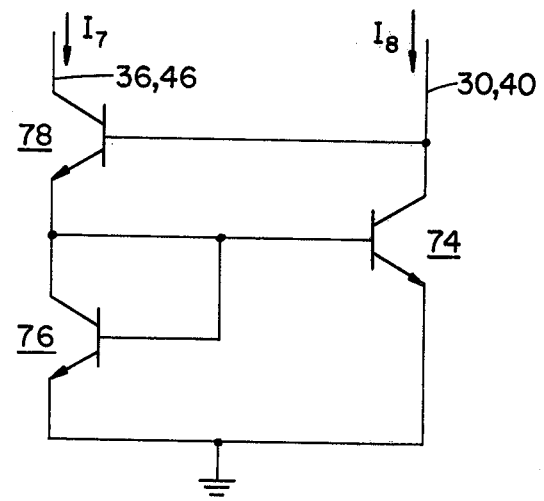
FIG. 5 illustrates a three transistor current mirror also useful in the circuits of FIG. 1 and FIG. 2.

An improvement over the operation of the two transistor current mirror shown in FIG. 4 may be obtained by using a three transistor current mirror such as is illustrated in FIG. 5. The current mirror illustrated in FIG. 5 comprises a first transistor 74 having its base terminal connected to the base-collector junction of a second diode-connected transistor 76. The emitters of transistors 74 and 76 are connected in common to a reference potential. A third transistor 78 is provided having a base terminal connected to the collector of transistor 74 and an emitter terminal connected to the base-collector junction of transistor 76. It can be shown that a current mirror having this configuration is characterized by a current-transfer ratio $I_8/I_7 = (\beta^2 + 2\beta)/\beta^2 + 2\beta + 2)$. This current-transfer ratio approaches an equality condition between currents $I_7$ and $I_8$ substantially more rapidly than the current-transfer ratio characterizing the two transistor current mirrors shown in FIG. 4.

What has thus been shown is an improved full-wave rectifier circuit capable of operating in response to extremely low-level input signals. In this regard, the rectifier circuit, among other applications, is particularly useful in a low-level envelope type video detector.

While a particular embodiment of the present invention has been shown and described, it will be obvious to those skilled in the art that various changes and modifications may be made without departing from the invention in its broader aspect. The aim in the appended claims is to cover all such changes and modification as may fall within the true spirit and scope of the invention.

I claim:

1. A full-wave rectifier circuit comprising:
   first and second transistors of like conductivity, the collectors of said transistors being connected together forming an output of said rectifier;
   first and second current mirrors each having an input and an output, the emitters of said first and second transistors being connected for supplying said inputs of said first and second current mirrors respectively and the bases of said first and second transistors being connected to said outputs of said first and second current mirrors respectively;
   first means coupling the emitter of said first transistor to the base of said second transistor;
   second means coupling the emitter of said second transistor to the base of said first transistor; and
   means coupling an alternating current signal to the base of at least one of said transistors.

2. The full-wave rectifier according to claim 1 wherein said first and second means each comprise resistive means.

3. The full-wave rectifier according to claim 1 including a signal source developing a pair of differential output alternating current signals, each of said output signals being coupled to the base of one of said transistors.

4. The full-wave rectifier according to claim 1 including first and second sources of DC bias current each connected for supplying the base of one of said transistors and a signal source developing an output alternating current connected in series aiding relationship with one of said sources of DC bias current.

* * * * *